(12) United States Patent
Albrecht

(10) Patent No.: US 9,404,982 B2
(45) Date of Patent: Aug. 2, 2016

(54) MRT-RF PUSH PULL POWER MODULES

(71) Applicant: Adam Albrecht, Nürnberg (DE)

(72) Inventor: Adam Albrecht, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 494 days.

(21) Appl. No.: 13/935,560

(22) Filed: Jul. 5, 2013

(65) Prior Publication Data

US 2014/0009160 A1   Jan. 9, 2014

(30) Foreign Application Priority Data

Jul. 5, 2012   (DE) .......................... 10 2012 211 763

(51) Int. Cl.
  *G01V 3/00*    (2006.01)
  *G01R 33/28*   (2006.01)
  *G01R 33/36*   (2006.01)

(52) U.S. Cl.
  CPC ............ *G01R 33/28* (2013.01); *G01R 33/3614* (2013.01)

(58) Field of Classification Search
  USPC ......................................................... 324/322
  See application file for complete search history.

(56) References Cited

U.S. PATENT DOCUMENTS

| | | | | |
|---|---|---|---|---|
| 4,120,019 A | * | 10/1978 | Arii | F28F 1/20 174/15.2 |
| 4,204,246 A | * | 5/1980 | Arii | F28D 15/0266 165/104.14 |
| 4,720,981 A | * | 1/1988 | Helt | F25B 40/00 165/80.4 |
| 5,889,651 A | * | 3/1999 | Sasaki | G01R 31/2891 165/908 |
| 6,252,771 B1 | * | 6/2001 | Jordan | H01L 23/4006 165/80.4 |
| 6,758,563 B2 | * | 7/2004 | Levola | A61B 3/113 351/209 |
| 6,943,551 B2 | | 9/2005 | Eberler et al. | |
| 7,411,450 B2 | | 8/2008 | Albrecht | |
| 2007/0257675 A1 | | 11/2007 | Marek et al. | |
| 2007/0257676 A1 | | 11/2007 | Sacher et al. | |
| 2008/0208035 A1 | | 8/2008 | Nistler et al. | |
| 2012/0187951 A1 | | 7/2012 | Albrecht et al. | |
| 2012/0188717 A1 | | 7/2012 | Albrecht et al. | |
| 2013/0076359 A1 | * | 3/2013 | Albrecht | H03F 21/00 324/322 |
| 2013/0147486 A1 | * | 6/2013 | Albrecht | H05K 7/2089 324/322 |

FOREIGN PATENT DOCUMENTS

| | | |
|---|---|---|
| CN | 101254100 A | 9/2008 |
| DE | 103 14 215 B4 | 11/2006 |
| DE | 10 2005 058 039 A1 | 6/2007 |
| DE | 10 2010 032 077 A1 | 1/2012 |
| DE | 10 2010 032 078 A1 | 1/2012 |
| JP | 2007298518 A | 11/2007 |
| WO | WO2006137946 A2 | 12/2006 |

OTHER PUBLICATIONS

German Office Action dated Apr. 10, 2013 for corresponding German Patent Application No. DE 10 2012 211 763.6 with English translation.

* cited by examiner

*Primary Examiner* — Rodney Fuller
(74) *Attorney, Agent, or Firm* — Lempia Summerfield Katz LLC

(57) ABSTRACT

A circuit arrangement including a plurality of amplifier stages to amplify an electrical RF signal for a magnetic resonance tomography device is provided. The plurality of amplifier stages is arranged on at least one circuit board. A circuit board of the at least one circuit board surrounds a cooling pipe.

22 Claims, 5 Drawing Sheets

US 9,404,982 B2
1

MRT-RF PUSH PULL POWER MODULES

This application claims the benefit of DE 10 2012 211 763.6, filed on Jul. 5, 2012, which is hereby incorporated by reference.

BACKGROUND

Magnetic resonance devices (MRTs) for examination of objects or patients by magnetic resonance tomography are known, for example, from DE10314215B4.

SUMMARY

The scope of the present invention is defined solely by the appended claims and is not affected to any degree by the statements within this summary.

The present embodiments may obviate one or more of the drawbacks or limitations in the related art. For example, a circuit arrangement may be optimized.

DETAILED DESCRIPTION

Figure 7:
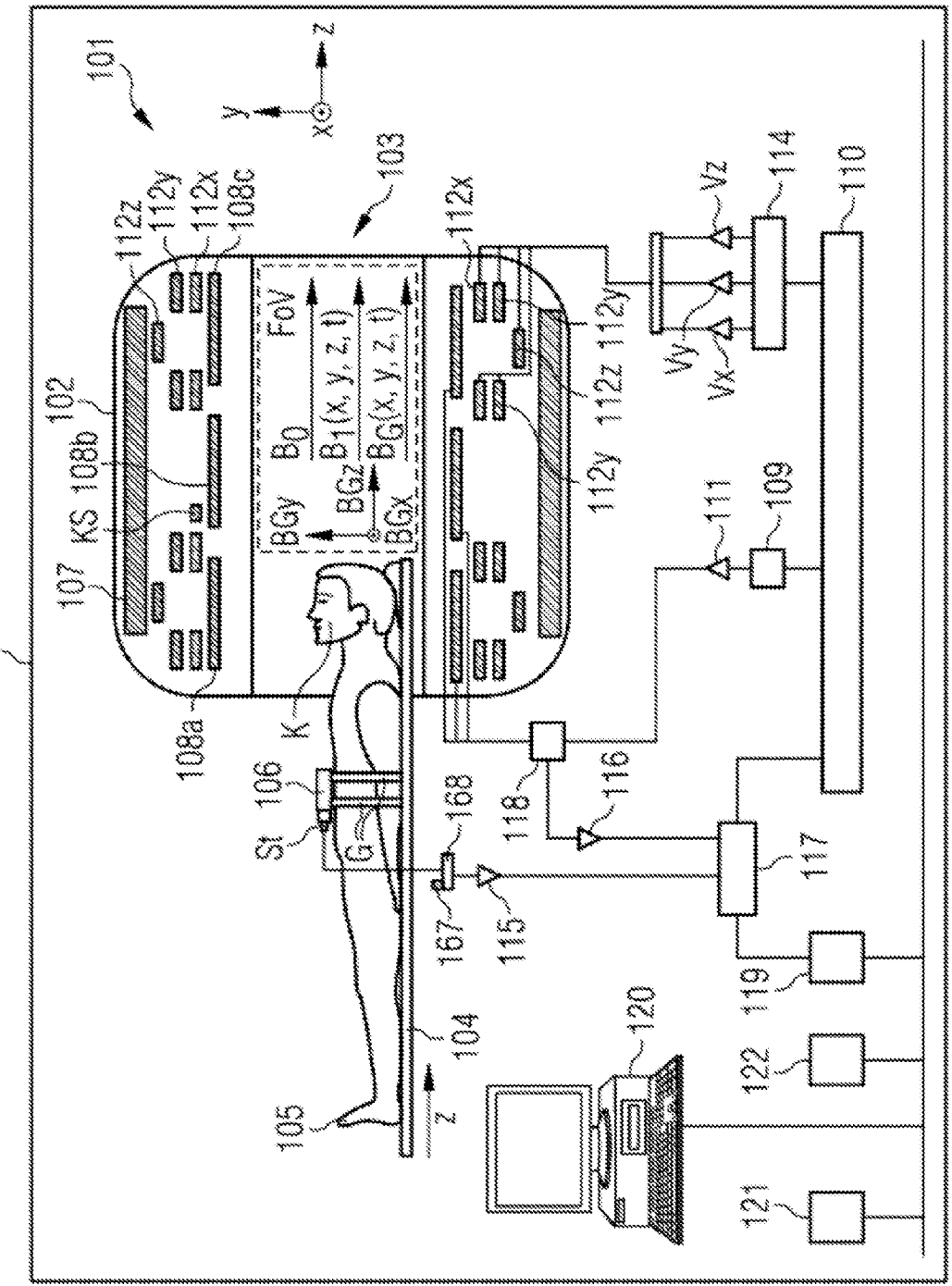
FIG. 7 shows a schematic of one embodiment of a magnetic resonance tomography (MRT) system.

FIG. 7 shows one embodiment of an imaging magnetic resonance device MRT 101 (e.g., located in a shielded room or Faraday cage F) with a whole body coil 102 with a tubular space 103 into which a patient couch 104 with a body 105 (e.g., of an object to be examined such as a patient; with or without local coil arrangement 106 attached with straps G with a controller St) may be moved in the direction of the arrow z in order to generate images of the patient 105 or of an area of the body K by an imaging method. A local coil arrangement 106, with which in a local area (e.g., field of view (FoV)) of the MRT images of a part area of the body 105 may be generated in the FoV. Signals of the local coil arrangement 106 may be evaluated by an evaluation device (e.g., including elements 168, 115, 117, 119, 120, 121) of the MRT 101 that may be connected via coaxial cable or wirelessly (e.g., element 167), for example, to the local coil arrangement 106 (e.g., converted into images, stored or displayed).

In order to examine the body 105 (e.g., the object to be examined or the patient) with the magnetic resonance device MRT 101 using magnetic resonance imaging, different magnetic fields matched as closely as possible to one another in temporal and spatial characteristic are irradiated onto the body 105. A strong magnet (e.g., a cryomagnet 107) in a measurement chamber (e.g., with a tunnel shaped opening 103) creates a statically strong main magnetic field $B_0$ that amounts, for example, to between 0.2 Tesla and 3 Tesla or even more. The body to be examined 105 is moved, supported on a patient couch 104, into a roughly homogeneous area of the main magnetic field B0 in the field of view area FoV. An excitation of the nuclear resonance of atomic nuclei of the body 105 is brought about via magnetic high-frequency excitation pulses B1 (x, y, z, t) that may be irradiated via a high-frequency antenna shown in FIG. 7 simplified as a body coil 108 (e.g., a multipart coil 108a, 108b, 108c and/or a local coil arrangement). High-frequency excitation pulses are generated, for example, by a pulse generation unit 109 that is controlled by a pulse sequence control unit 110. After amplification by a high-frequency amplifier 111, the high-frequency excitation pulses are conveyed to the high-frequency antenna 108. The high-frequency system shown in FIG. 7 is merely indicated schematically. In other embodiments, more than one pulse generation unit 109, more than one high-frequency amplifier 111 and a number of high-frequency antennas 108a, b, c are used in a magnetic resonance device 101.

The magnetic resonance device 101 also has gradient coils 112x, 112y, 112z, with which, during a measurement, magnetic gradient fields $B_G$(x, y, z, t) are radiated in (e.g., beamed in) for selective slice excitation and for local encoding of the measurement signal. The gradient coils 112x, 112y, 112z are controlled by a gradient coil control unit 114 (and possibly via amplifiers Vx, Vy, Vz), which, like the pulse generation unit 109, is connected to the pulse sequence control unit 110.

Signals transmitted by the excited nuclear resonance of the atomic nuclei in the object under examination are received by the body coil 108 and/or at least one local coil arrangement 106, amplified by assigned high-frequency preamplifiers 116 and further processed and digitized by a receiver unit 117. The recorded measurement data is digitized and stored as complex numerical values in a k-space matrix. An associated MR image may be reconstructed from the k-space matrix occupied by values using a multidimensional Fourier transformation.

For a coil that may be operated both in transmit mode and also in receive mode, such as, for example, the body coil 108 or a local coil 106, the correct signal forwarding is regulated by an upstream transceiver branch 118.

An image processing unit 119 creates an image from the measurement data, which is displayed via an operating console 120 to a user and/or is stored in a memory unit 121. A central processor unit 122 controls the individual system components.

In MR tomography, images with a high signal-to-noise ratio (SNR) may be recorded with local coil arrangements. The local coil arrangements are antenna systems that are attached in the immediate vicinity at (e.g., anterior), below (e.g., posterior), on or in the body 105. During an MR measurement, the excited nuclei induce a voltage in the individual antennas of the local coil. The induced voltage is amplified by a low-noise preamplifier (e.g., LNA, preamp) and is forwarded to the receive electronics. To improve the signal-to-noise ratio even in high-resolution images, high-field systems are used (e.g., 1.5 T-12 T and more). If more individual antennas may be connected to an MR receive system than there are receivers available, a switching matrix (e.g., an RCCS) is integrated between receive antennas and receivers. This matrix routes the currently active receive channels (e.g., the receive channels that currently lie in the FoV of the magnet) to the available receivers. This makes it possible to connect more coil elements than there are receivers available, since for whole body coverage, the coils that are located in the FoV or in the homogeneity volume of the magnet have are to be read out.

In one embodiment, the local coil arrangement 106 is an antenna system that may include one, or as an array coil, a plurality of antenna elements (e.g., coil elements). The individual antenna elements are, for example, configured as loop antennas (e.g., loops), butterfly coils, flex coils or saddle coils. A local coil arrangement may include coil elements, a preamplifier, further electronics (e.g., sheath current filters), a housing, supports and a cable with plug, through which the coil elements are connected to the MRT system. A receiver 168 attached to the system side filters and digitizes a signal received from a local coil 106 (e.g., wirelessly) and transfers the data to a digital signal processing device. The digital signal processing device may derive an image or a spectrum from the data obtained by a measurement and make the image or the spectrum available to the user (e.g., for subsequent diagnosis by the user and/or for storage).

Figure 1:
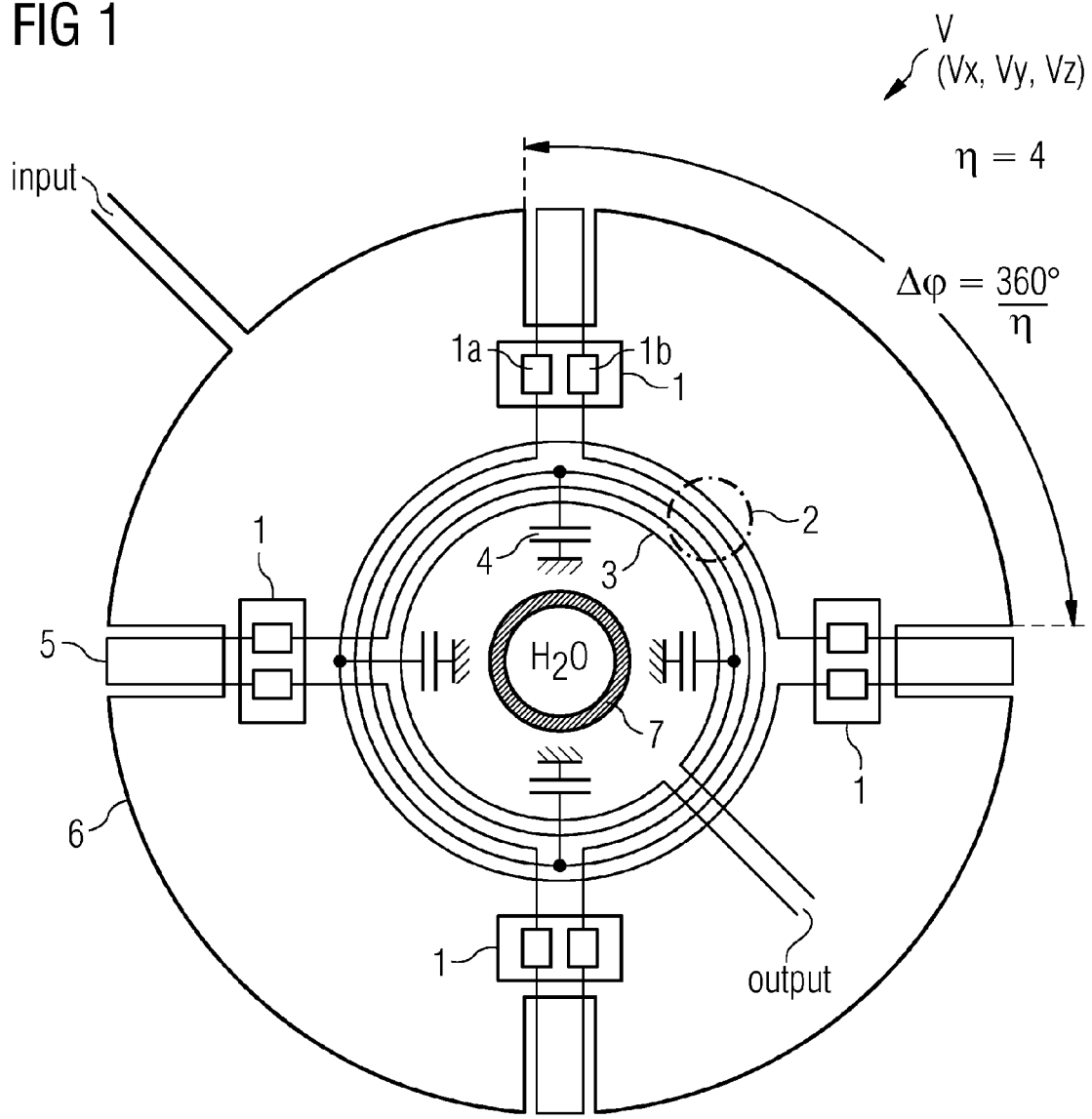
FIG. 1 shows a schematic, simplified circuit diagram of elements of one embodiment of a circuit arrangement.

FIG. 1 shows a simplified schematic of elements of one embodiment of a circuit arrangement V as a circuit diagram, which may be used, for example, as an amplifier device Vx and/or Vy and/or Vz in a magnetic resonance tomography device such as in FIG. 7, for example. The circuit arrangement V amplifies an RF signal (e.g., input signal, RF input signal or MRT-RF input signal) "input" to an output signal "output" (e.g., an RF input signal or RF signal for a magnetic resonance tomography device 101).

For amplification, the circuit arrangement V has a number (e.g., four) of amplifier stages 1 arranged around at least one (or in FIG. 5, two or more) cooling pipe 7 common to the amplifier stages 1 and passed through by a liquid (e.g., water). The amplifier stages 1 may include push pull power modules 1 each with two chips 1a, 1b with amplifiers such as semiconductor power transistors, for example.

The amplifier stages 1 are arranged, for example, on a printed circuit board (PCB) that is arranged around a cooling pipe 7.

The input signal "input", in each case, is fed (e.g., if necessary, phase offset by f=Fi=360°/n for the number (n) of amplifier stages 1 around a cooling pipe common to the amplifier stages 1) into an amplifier stage 1 of the circuit arrangement V at an input via a transformer (e.g., with or without core) including a pair (e.g., including elements 5 and 6) of input transformer primary windings 6 and input transformer secondary windings 5. Instead of the only one input transformer primary winding 6 and input transformer secondary winding 5 shown for the purposes of simplification, a number of windings may also be provided in each case.

Phases (e.g., of the common input signal "input" in input signal portions phase-offset to one another by f=Fi=360°/n for the n inputs of the n amplifier stages 1 or the inputs of the transformers upstream from the amplifier stages 1) may be offset by a signal divider not shown in FIG. 1 for reasons of clarity. On the output side of the signal divider, lines may run to each of the n amplifier stages 1 (or the inputs of transformers upstream from the amplifier stages 1).

The input signal "input" amplified by a respective amplifier stage (e.g., fed to the n amplifier stages 1 phase-offset by Fi=360°/n to one another) is output as "output" to an output via a transformer (e.g., with or without core) including in each case a pair (e.g., No. 2 and No. 3) of output transformer primary windings 2 (e.g., provided individually and separately for each of the amplifier stages 1) and an output transformer secondary winding 3 (e.g., surrounded by a cooling pipe common to the (n) amplifier stages 1). The output signal "output" is output by the output transformer secondary winding 3 (e.g., the input signal "input" amplified by a number of amplifier stages 1 separately (phase-offset from one another)).

Power supply capacitors 4, via which power may be supplied to an amplifier stage 1 in each case, are also shown in FIG. 1.

Figure 2:
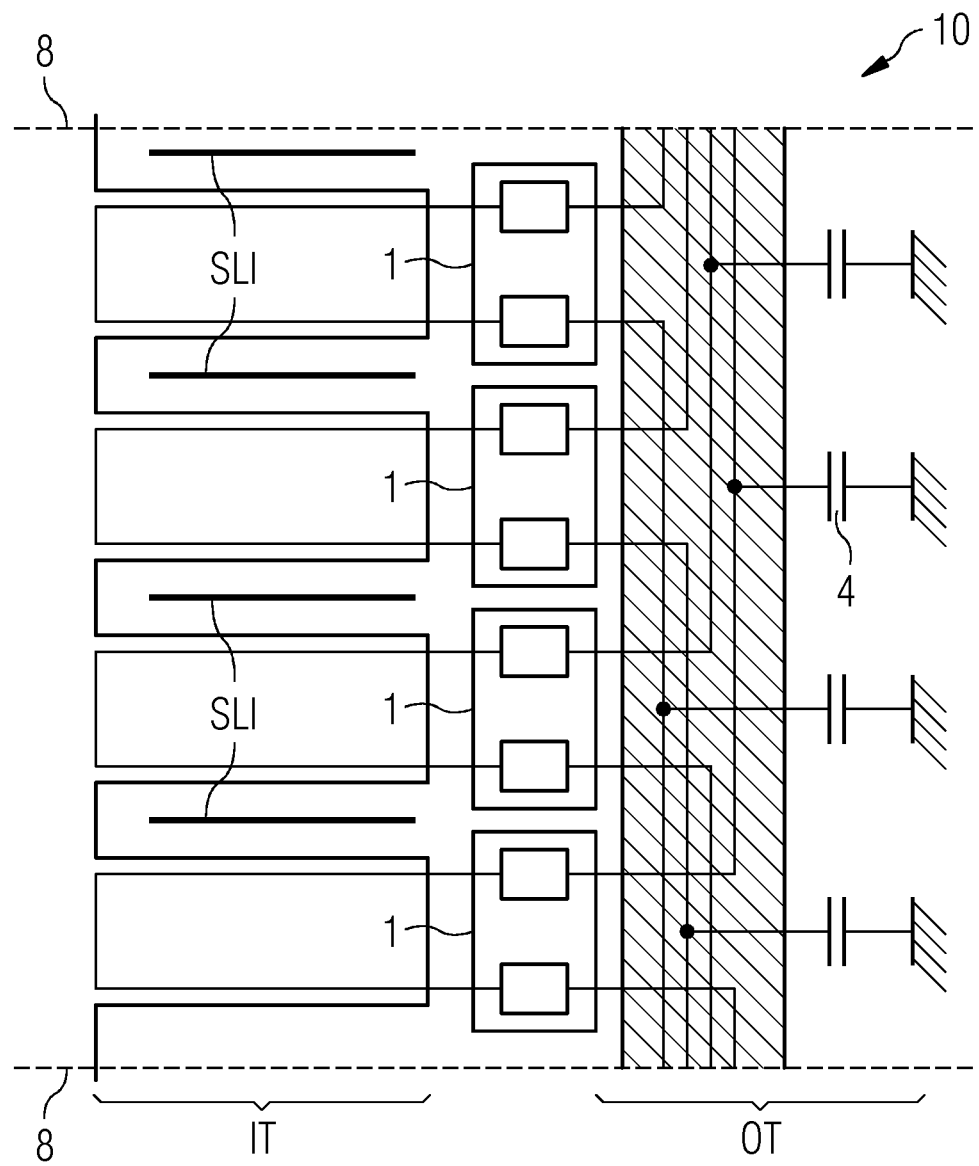
FIG. 2 shows one embodiment of amplifier stages on a planar circuit board with slits.

FIG. 2 shows amplifier stages 1 arranged on a planar (e.g., flat) circuit board or PCB 10. The circuit board 10 is flexible in order to arrange the circuit board 10 around and/or wind the circuit board 10 externally around a cooling pipe 7.

Ends 8 (e.g., top and bottom in FIG. 2) of the circuit board 10, when the circuit board 10 is arranged and/or wound around the cooling pipe 7, may rest against each other and/or be connected to one another and/or overlap one another.

The flexibility of the circuit board 10 is optimized by slits SLI in the circuit board 10.

Pairs of input windings and output windings of input transformer IT (e.g., corresponding to elements 5 and 6 in FIG. 1) are shown on the left in FIG. 2. Pairs of input windings and output windings of output transformer OT (e.g., corresponding to elements 2 and 3 in FIG. 1) are shown on the right in FIG. 2. Amplifier stages 1 are shown in each case between input transformers IT and output transformers OT.

The field in one or in each input transformer is orthogonal, for example, to the field in one or in each output transformer, so that faults or crosstalk is avoided.

Figure 3:
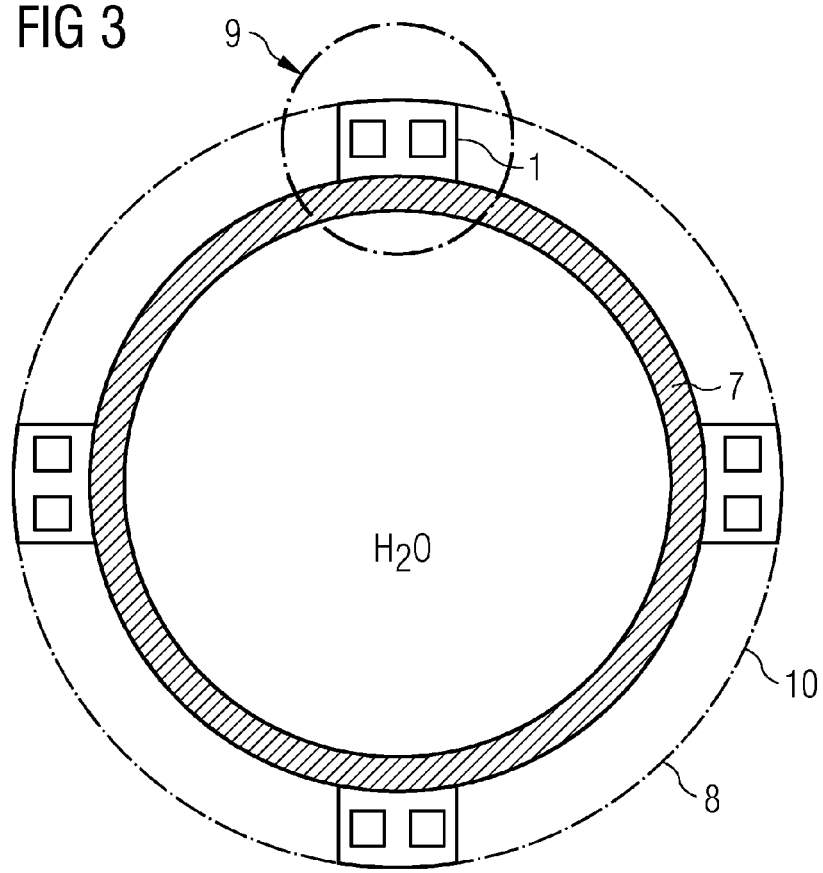
FIG. 3 shows a simplified cross-section of one embodiment of a cooling pipe filled with water with four amplifier stages.

FIG. 3 shows a simplified cross-section of a cooling pipe 7 filled with, for example, water $H_2O$, with four amplifier stages 1 (e.g., push pull groups in each case) that are arranged on a PCB 10 that surround the cooling pipe 7 (e.g., externally).

To optimize the cooling, the cooling pipe 7 shown may include a further pipe not shown in the diagram within the cooling pipe 7.

Figure 4:
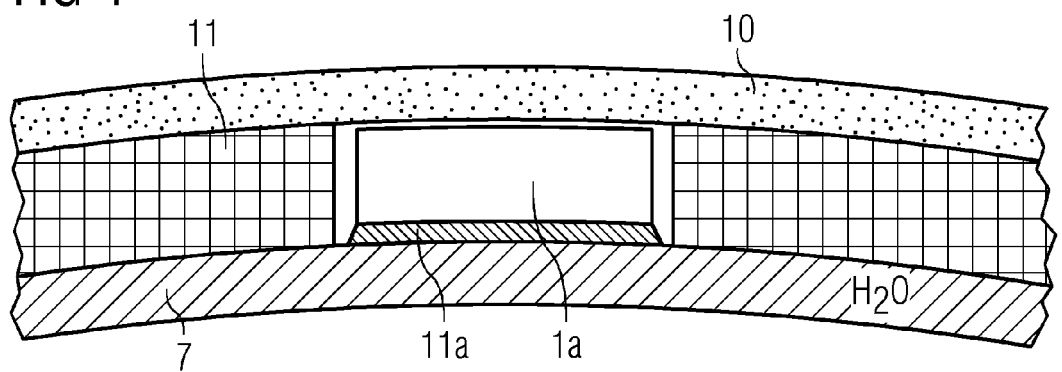
FIG. 4 shows a detail of one embodiment of thermal transfer elements and heat isolation pads on a cooling pipe.

The area 9 in FIG. 3 is shown in greater detail in FIG. 4.

FIG. 4 shows as a detail of at least one heat conducting element 11a in the form of thermal pads 11a, which, because of high thermal conductivity, optimize the thermal transfer of amplifiers 1a, 1b to the cooling pipe 7 and thereby to the water therein. FIG. 4 further shows the electrically-isolating thermal transfer foil 11 between the circuit board 10 and the cooling pipe 7.

Figure 5:
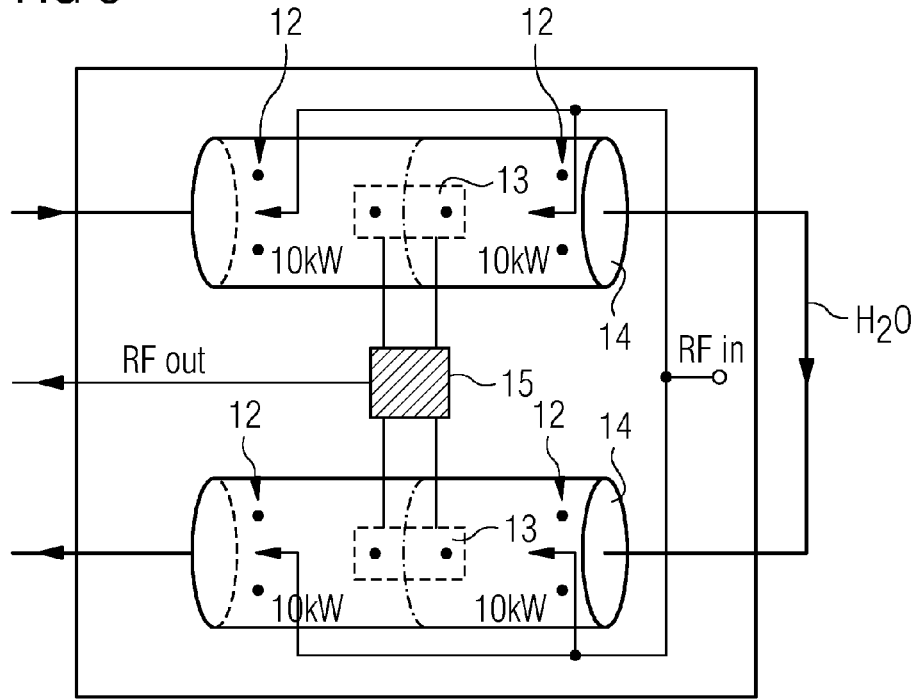
FIG. 5 shows one embodiment of two liquid-filled cooling pipes with amplifier stages arranged around the two liquid-filled cooling pipes.

FIG. 5 shows one embodiment, in which instead of a liquid-filled cooling pipe 7, as in FIG. 1, around which all amplifier stages 1 are arranged, two or more liquid-filled cooling pipes 14 (e.g., with amplifier stages 1 arranged around the cooling pipes 14 each with around 10 kW output power) are provided. In FIG. 5, a matching network 15 is shown for the output signals of the amplifier stages 1 surrounding the two cooling pipes 14. The output signal "RF out" of the matching network 15 may be transferred to RF antennas of an MRT. The matching network 15 may include a balun (e.g., a symmetry element).

In the example in FIG. 5, the liquid-filled cooling pipes 14 are behind one another and have $H_2O$ flowing through the liquid-filled cooling pipes 14.

Figure 6:
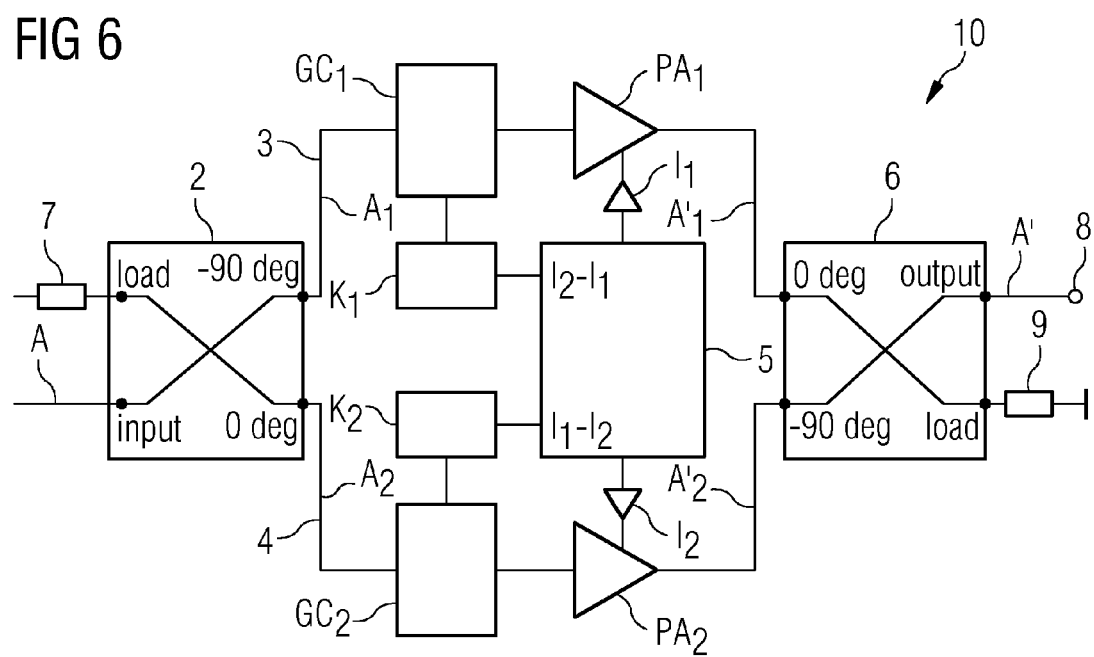
FIG. 6 shows one embodiment of a push-pull power module with two amplifiers as an amplifier stage.

FIG. 6 shows a push pull group 1 known from DE102005058039A1 with two amplifiers 1a, 1b, as is able to be used in arrangements of one or more of the present embodiments as amplifier stage 1 (e.g., for an RF input signal for RF antennas of a magnetic resonance tomography device 101). Many other types of amplifier stages 1 may also be used.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A circuit arrangement comprising:
a plurality of amplifier stages, the plurality of amplifier stages operable to amplify an electrical radio frequency (RF)-signal for a magnetic resonance tomography (MRT) device,
wherein the plurality of amplifier stages is arranged on at least one printed circuit board, and
wherein a circuit board of the at least one printed circuit board surrounds a cooling pipe.

2. The circuit arrangement as claimed in claim 1, wherein the RF-signal is fed into amplifier stages of the plurality of amplifier stages in each case via at least one input transformer primary winding and at least one input transformer secondary winding.

3. The circuit arrangement as claimed in claim 1, wherein output signals of amplifier stages of the plurality of amplifier stages are output via at least one output transformer primary winding per amplifier stage and via at least one output transformer secondary winding common to amplifier stages of the plurality of amplifier stages surrounding the cooling pipe.

4. The circuit arrangement as claimed in claim 1, wherein amplified part signals are combined with a signal combination element downstream from the plurality of amplifier stages into an output signal.

5. The circuit arrangement as claimed in claim 1, wherein an output power of an amplifier stage of the plurality of amplifier stages is ten Kilowatts.

6. The circuit arrangement as claimed in claim 1, wherein the circuit board is flexible or bent, such that the circuit board is arrangeable, windable, or arrangeable and windable around the cooling pipe.

7. The circuit arrangement as claimed in claim 1, wherein the circuit board includes slits in the circuit board.

8. The circuit arrangement as claimed in claim 7, wherein the slits improve flexibility of the circuit board compared to a circuit board without slits.

9. The circuit arrangement as claimed in claim 1, wherein a field in one or in each input transformer is orthogonal to a field in one or in each output transformer.

10. The circuit arrangement as claimed in claim 1, wherein the cooling pipe is filled with a liquid.

11. The circuit arrangement as claimed in claim 10, wherein the liquid is water.

12. The circuit arrangement as claimed in claim 1, wherein the cooling pipe includes a further pipe within the cooling pipe.

13. The circuit arrangement as claimed in claim 1, wherein the circuit board surrounds an external circumference of the cooling pipe.

14. The circuit arrangement as claimed in claim 1, wherein the circuit board surrounds a complete outer circumference of the cooling pipe.

15. The circuit arrangement as claimed in claim 1, further comprising thermal transfer elements provided between amplifiers of an amplifier stage of the plurality of amplifier stages and the cooling pipe.

16. The circuit arrangement as claimed in claim 1, further comprising electrically-isolating thermal transfer films provided between the circuit board and the cooling pipe.

17. The circuit arrangement as claimed in claim 1, wherein at least some amplifier stages of the plurality of amplifier stages include push pull groups.

18. The circuit arrangement as claimed in claim 1, further comprising an output network provided for output signals of the plurality of amplifier stages surrounding the cooling pipe.

19. The circuit arrangement as claimed in claim 18, wherein the output network comprises a balun, a symmetry element, or the balun and the symmetry element.

20. The circuit arrangement as claimed in claim 1, wherein the circuit arrangement is an MRT-RF signal amplification device.

21. The circuit arrangement as claimed in claim 1, further comprising:
thermal transfer pads provided between amplifiers of an amplifier stage of the plurality of amplifier stages and the cooling pipe; and
electrically-isolating thermal transfer foil provided between the circuit board and the cooling pipe.

22. The circuit arrangement as claimed in claim 21, further comprising:
an output network provided for output signals of the plurality of amplifier stages surrounding the cooling pipe.

* * * * *